United States Patent
Zha et al.

(10) Patent No.: US 12,020,574 B2
(45) Date of Patent: Jun. 25, 2024

(54) CLOUD SIMULATION APPARATUS AND METHOD FOR VERIFYING RAIL TRANSIT-ORIENTED FULL-AUTOMATIC UNMANNED DRIVING SCENE

(71) Applicant: CASCO SIGNAL LTD., Shanghai (CN)

(72) Inventors: Wei Zha, Shanghai (CN); Tonghai Sun, Shanghai (CN); Yuesheng Du, Shanghai (CN); Jianzhong Zhou, Shanghai (CN); Hanzhe Deng, Shanghai (CN); Zhengbo Cheng, Shanghai (CN)

(73) Assignee: CASCO SIGNAL LTD., Shanghai (CN)

( * ) Notice: Subject to any disclaimer, the term of this patent is extended or adjusted under 35 U.S.C. 154(b) by 322 days.

(21) Appl. No.: 17/596,079

(22) PCT Filed: Oct. 19, 2020

(86) PCT No.: PCT/CN2020/121797
§ 371 (c)(1),
(2) Date: Dec. 2, 2021

(87) PCT Pub. No.: WO2021/218055
PCT Pub. Date: Nov. 4, 2021

(65) Prior Publication Data
US 2022/0319333 A1    Oct. 6, 2022

(30) Foreign Application Priority Data
Apr. 29, 2020   (CN) .......................... 202010356028.4

(51) Int. Cl.
*G08G 1/01*    (2006.01)
*B60W 60/00*   (2020.01)
(Continued)

(52) U.S. Cl.
CPC .......... *G08G 1/202* (2013.01); *B60W 60/001* (2020.02); *G08G 1/0145* (2013.01); *B60W 2420/403* (2013.01); *G06F 30/20* (2020.01)

(58) Field of Classification Search
CPC ...... G06F 11/3668; G06F 30/15; G06F 30/20; G06Q 10/06; G06Q 50/30; G08G 1/0145;
(Continued)

(56) References Cited

U.S. PATENT DOCUMENTS 10,234,853 B2 *  3/2019  Mukkamala ............ H04L 63/18
10,514,462 B2 * 12/2019  England ............... G05D 1/0248
(Continued)

FOREIGN PATENT DOCUMENTS

CN    105923022 A  *  9/2016  .............. B61L 27/00
CN    108009097 A  *  5/2018  .......... G06F 11/3668
(Continued)

OTHER PUBLICATIONS

Kolli, Samuel Sushanth. "Evaluating Energy Consumption of Distributed Storage Systems: Comparative analysis.". (Year: 2016).*
(Continued)

*Primary Examiner* — Cuong H Nguyen
(74) *Attorney, Agent, or Firm* — HSML P. C.

(57) ABSTRACT

The present invention relates to a cloud simulation apparatus and method for verifying a rail transit-oriented full-automatic unmanned driving scene, where the apparatus includes a cloud access terminal and a cloud server terminal. The cloud server terminal includes a central dispatching module, a station control module, a rail-mounted module, an interface logic management layer, and a device base layer, the cloud access terminal is connected to the central dispatching module, the central dispatching module is connected to the station control module and the rail-mounted module respectively, every two of the station control module, the rail-
(Continued)

mounted module, and the interface logic management layer are connected, and the interface logic management layer is connected to the device base layer. Compared with the prior art, the present invention has the advantages that a fault injection test can be performed flexibly, a function test under degradation and emergency operation scenes can be performed more comprehensively, and a large-scale verification work on site can be avoided, and the like.

9 Claims, 2 Drawing Sheets

(51) Int. Cl.
  *G08G 1/00* (2006.01)
  *G06F 30/20* (2020.01)
(58) Field of Classification Search
  CPC ........ G08G 1/202; G05B 17/02; G05B 17/00; B61L 27/00; B60W 60/001; B60W 2420/42
  USPC .............................................. 703/17; 706/21
  See application file for complete search history.

(56) References Cited

U.S. PATENT DOCUMENTS

| 11,727,169 | B2* | 8/2023 | St. Romain, II ......... G06N 3/08 706/16 |
| 2012/0173717 | A1 | 7/2012 | Kohli |
| 2020/0222808 | A1* | 7/2020 | Wencel ................. A63F 13/822 |
| 2022/0126864 | A1* | 4/2022 | Moustafa ......... G08G 1/096775 |

FOREIGN PATENT DOCUMENTS

| CN | 108009097 A | | 5/2018 | |
| CN | 108922188 A | * | 11/2018 | ............ G08G 1/012 |
| CN | 109747682 A | | 5/2019 | |
| CN | 110329319 A | | 10/2019 | |
| CN | 111413892 A | | 7/2020 | |
| CN | 212060893 U | * | 12/2020 | |
| CN | 113495495 A | * | 10/2021 | ............ G05B 17/02 |
| CN | 115841044 A | * | 3/2023 | |
| WO | WO-2021218055 A1 | * | 11/2021 | .......... B60W 60/001 |

OTHER PUBLICATIONS

Jiang, Zheyuan, and Guangan Shang. "Business-oriented Enterprise Cloud Services framework." Proceedings of 2013 3rd International Conference on Computer Science and Network Technology. IEEE,. (Year: 2013).*
K. Djemame et al., "PaaS-IaaS Inter-Layer Adaptation in an Energy-Aware Cloud Environment," in IEEE Transactions on Sustainable Computing, vol. 2, No. 2, pp. 127-139, Apr. 1-Jun. 2017, doi: 10.1109/TSUSC.2017.2719159. (Year: 2017).*
H. Liu, "Research on the framework of Decision Support Platform for the Lower Yellow River Based on Cloud Computing," 2022 8th Annual International Conf on Network and Info Syst for Computers (ICNISC), Hangzhou, China, 2022, pp. 505-508, doi: 10.1109/ICNISC57059.2022.00106 (Year: 2022).*
International Search Report (with English translation) and Written Opinion issued in PCT/CN2020/121797, dated Jan. 27, 2021, 10 pages provided.
Xi et al., "Design of metro automatic without driver mode and signal simulation platform", Railway Signalling & Communiction, vol. 52, No. 9, Sep. 2016, 4 pages provided, with English Abstract.

* cited by examiner

CLOUD SIMULATION APPARATUS AND METHOD FOR VERIFYING RAIL TRANSIT-ORIENTED FULL-AUTOMATIC UNMANNED DRIVING SCENE

FIELD OF TECHNOLOGY

The present invention relates to the field of full-automatic unmanned driving of a rail transit, and in particular, to a cloud simulation apparatus and method for verifying a rail transit-oriented full-automatic unmanned driving scene.

BACKGROUND

A rail transit operation and control system is a complex control system with a high precision requirement and a high safety requirement, and is also a development direction of a domestic subway operation and control system in the future, which can obviously achieve member reduction and efficiency improvement for subway enterprises. At present, a domestic rail transit industry is actively researching a full-automatic operation unmanned driving system oriented to a GOA 4-level, and the full-automatic operation unmanned driving system integrates disciplines such as signal, integrated supervision, platform door, vehicle, communication, automatic fare collection, PIS, PA, and CCTV, makes a design specification for all full-automatic unmanned driving scenes in the rail transit, including a normal operation scene, an emergency scene, and a fault scene, and is configured to guide design and implementation of a full-automatic unmanned driving project subsequently.

Currently, in the field of rail transit full-automatic unmanned driving research, a corresponding unmanned driving scene is usually researched and extracted from a full-automatic unmanned driving requirement, to form an unmanned driving scene file for guiding development, verification and project implementation of the rail transit full-automatic unmanned driving system. In addition, for verification of the rail transit unmanned driving scene, a plurality of professional devices such as the signal, the integrated supervision, the platform door, the vehicle, the communication, the automatic fare collection, the PIS, the PA, and the CCTV in the rail transit industry are crossed. Because there are a large quantity of professional device of each subsystem, and the interface is complex, it is difficult to have a set of systematic method and apparatus for verifying a rail transit-oriented full-automatic unmanned driving scene that can implement multi-discipline integration and cross-discipline linkage.

If the rail transit full-automatic unmanned driving scene verification system adopts all real hardware devices, a large number of hardware device purchasing costs are required, and requirements on the space and wiring are very high. The following are specific problems.
1. Cost problem: a rail transit-related hardware device is expensive, and a corresponding verification platform uses excessive physical hardwares, resulting in excessive high development and construction costs and a high space occupation rate.
2. Space problem: excessive physical hardwares are adopted, resulting in increasing of a quantity of cabinet devices and waste of the space.
3. Problem of verification platform compatibility and scalability: if most devices of a verification platform are formed by hardware physical devices, each device has specific software and hardware interfaces, resulting in a limitation on compatibility and scalability of a simulation interface and difficult in implementing multi-discipline linkage integrated verification.
4. Flexibility problem of application management: the rail transit full-automatic unmanned driving system is strong in specificity and high in complexity, and a large quantity of manpower and energy is required to manage an environment such as a power supply system, a network system, or a software and a hardware of each subsystem when test and verification environment management is performed, affecting development of the verification work.

SUMMARY

The purpose of the present invention is to provide a cloud simulation apparatus and method for verifying a rail transit-oriented full-automatic unmanned driving scene to overcome defects in the prior art.

The objective of the present invention may be achieved through the following technical solutions:

A cloud simulation apparatus for verifying a rail transit-oriented full-automatic unmanned driving scene is provided, the cloud simulation apparatus including a cloud access terminal and a cloud server terminal, where the cloud server terminal includes a central dispatching module, a station control module, a rail-mounted module, an interface logic management layer, and a device base layer, the cloud access terminal is connected to the central dispatching module, the central dispatching module is connected to the station control module and the rail-mounted module respectively, every two of the station control module, the rail-mounted module, and the interface logic management layer are connected, and the interface logic management layer is connected to the device base layer.

Preferably, the cloud access terminal is connected to the central dispatching module by a virtual desktop infrastructure (VDI) communication protocol.

The cloud access terminal is configured to implement controls and operations of a cloud access user, and to feedback and display operation results.

Preferably, the central dispatching module includes a driving dispatching server, a vehicle dispatching server, a passenger dispatching server, a device dispatching server, a director dispatching server, and a maintenance dispatching server that are connected to each other through a communication network, and the servers are implemented through software simulation.

The central dispatching module is configured to: perceive and dynamically predict a passenger flow from multiple dimensions, implement accurate map paving, intelligent map adjustment and road-network collaboration, intelligently recognize a fault scene and an emergency scene and assist in decision-making, and perform multi-professional and multi-line fusion command based on a big data and intelligent calculation engine.

Preferably, the station control module includes an automatic train supervision (ATS) workstation, an integrated supervisory control system (ISCS) workstation, a station ATS server, a station ISCS server, an integrated backup panel (IBP) disk, a local ATS (LATS) server, and a station front end processor (FEP) that are connected to each other through a communication network, and the devices are implemented through software simulation.

The station control module provides three functions of intelligent passenger transport management, equipment management, and passenger service around passenger service, including: (1) intelligent linkage of station systems and patterned control: efficient linkage between a normal mode and a fault mode; (2) intelligent collection and response of passenger flow information; (3) all-round passenger information prompt; (4) intelligent and energy-saving operation of the station systems; and (5) intelligent inspection.

Preferable, the rail-mounted module includes a vehicle-mounted device and a railside device that are both implemented through software simulation.

The vehicle-mounted device includes a vehicle-mounted controller, a vehicle-mounted passenger information system (PIS), a vehicle-mounted train control and management system (TCMS), a multifunction vehicle bus (MVB), a vehicle-mounted integrated supervision apparatus, a WIFI module, a vehicle-ground communication module, and a 3D driving simulation module, the MVB is connected to the vehicle-mounted integrated supervision apparatus, the vehicle-mounted TCMS, and the vehicle-mounted controller respectively, the vehicle-mounted controller is connected to the vehicle-mounted TCMS and the vehicle-ground communication module respectively, and the vehicle-mounted integrated supervision apparatus is connected to the vehicle-mount PIS, the vehicle-mounted TCMS, and the WIFI module respectively.

The railside device includes a shielding door, a turnout, a signal machine, and a beacon.

The rail-mounted module is configured to implement automatic wake-up, vehicle track inspection, mainline operation, stopping and picking up, station departure, emergency intercom, passenger clearing by using a video, and docking and dormancy.

Preferably, the interface logic management layer includes a scene management platform layer, a logic simulation platform layer, a station interface simulation platform layer, and a vehicle interface simulation platform layer.

The interface logic management layer includes interface adaption of devices, and simulation of a rail transit full-automatic logic and management of an unmanned driving scene, and is configured to receive upwardly an instruction delivered by a software service layer and transmit a message of the software service layer to the device base layer downwardly and provide service and management corresponding to the platform layers.

Preferably, the logic simulation platform layer includes an intelligent verification platform (IVP) server, and the scene management platform layer includes verification plan management, scene example management, a scene requirement management, scene environment management, verification resource management, scene configuration management, and scene report management.

Preferably, the device base layer includes an ISCS system, an automatic train control (ATC) system, an ATS system, and a continuous integration (CI) system.

The device base layer runs real rail transit full-automatic unmanned driving operation and control system software and data, and is configured to perform an interface test between systems, function and performance tests, an information security attack and defense drill test, and a fault injection test.

A cloud simulation method for verifying a rail transit-oriented full-automatic unmanned driving scene is provided, including the following steps:
step 1: starting, by a cloud access terminal, a virtual device software in a center software-as-a-service (SaaS) layer by using an Ethernet power supply management module, where the virtual device software includes a driving dispatching software, a vehicle dispatching software, an integrated dispatching software, a passenger dispatching software, and a maintenance dispatching software, covering signal dispatching, integrated supervision, and dispatching voice telephone systems;
step 2: controlling, by the center SaaS layer, the virtual device software in a station SaaS layer remotely by using a remote intelligent startup instruction to implement intelligent remote startup, where the station SaaS layer covers a signal ATS workstation software, an ISCS station workstation software, an IPB disk software, a station ATS server software, a station ISCS server software, an LATS software, and a station FEP software;
step 3: controlling a rail-mounted SaaS layer by both the center SaaS layer and the station SaaS layer and feeding information back to the center and the station, where the rail-mounted SaaS layer includes a vehicle model software, a vehicle door and platform door model software, a rail signal machine and turnout model software, a departure indicator software, a platform PIS/passenger address (PA) software, an SPKS/ESP model software, and a crowdedness degree display software, and integrates professional station rail-mounted region passenger service functions and operation safety device model and performs comprehensive function verification on station operation and passenger service scenes;
step 4: sending a result instruction calculated by using the SaaS layer to interface adapter resource pools included in a platform-as-a-service (PaaS) layer, where the interface adapter resource pools include a vehicle interface simulation platform resource pool and a station interface simulation platform resource pool, which are invoked by a logic simulation platform layer and a scene management platform layer in the PaaS layer for service;
step 5: the logic simulation platform layer in the PaaS layer including a set of virtual machine servers, configured to receive and send data sent by the vehicle interface simulation platform resource pool and the station interface simulation platform resource pool, and process instruction messages of the vehicle and the station, and controlled by a scene management service platform layer in the PaaS layer;
step 6: a scene management service in the PaaS layer including a series of cloud management basic services that are used for providing a platform-level scene management service and can be invoked by the SaaS layer, where the scene management service in the PaaS layer includes a verification plan management service, a scene example management service, a scene requirement management service, a scene environment management service, a scene configuration management service, and a scene report management service;
step 7: an infrastructure-as-a-service (IaaS) layer including a series of semi-physical semi-simulation full automatic unmanned driving operation and control system facilities, where all the facilities are physical or virtualized, and the facilities in the IaaS layer provide infrastructure facility services to the PaaS layer and are managed by the scene management service in the PaaS layer; and
step 8: performing data exchange among the SaaS layer, the PaaS layer, and the IaaS layer, all operations being derived from a cloud terminal of the uppermost layer, and providing real-time state data feedback to the cloud terminal.

Preferably, the station SaaS layer has a condition for implementing communication and linkage with the center SaaS layer and the rail-mounted SaaS layer, and a station operation scene and an emergency scene that are highly linked are verified by integrating functions of a plurality of subsystem involved in the station SaaS layer.

Compared with the prior art, the present invention has the following advantages:

1. Full discipline integration and cross discipline linkage of rail transit unmanned driving: signal, vehicle, communication, BAS, FAS, platform door, AFC, PIS/PA, CCTV, and other disciplines are integrated, and whether a function design and an interface design of systems meet a requirement under different scenes can be verified. An interface test between the disciplines of an unmanned driving system and function and performance tests of the system are performed without depending on an external field test line, to complete system integration confirmation in advance, reduce on-site debugging work, optimize a project construction period and ensure the publishing quality. Compared with the on-site test, the present invention has the advantages that a fault injection test can be performed flexibly, a function test under degradation and emergency operation scenes can be performed more comprehensively, thereby avoiding a large-scale verification work on site.

2. A real system and a virtual scene are linked, and an unmanned driving operation scene is verified: function modeling is performed on facilities in a rail transit full-automatic unmanned driving system, the facilities include an automatic parking lot, a vehicle, a railside, a platform, an exhibition hall device, and the like. Real devices of a core discipline are connected, passenger and operation and maintenance personnel behaviors are simulated, an operation and maintenance rule is imported, system responses under various operation scenes are deduced, and a design of an unmanned driving system operation scene is verified and evaluated. Pre-operation research is performed, rationality of an operation scene and an architecture design is verified, to ensure that designs of the function and the rule truly meet an operation requirement, and problems that are easy to be ignored in the design are found in time, thereby avoiding design pity and rework costs caused by the problems.

3. Research and verification on full-automatic operation solution of a new generation smart subway for the future: the cloud simulation platform can research the operation solution of the smart subway from dimensions such as intelligent dispatch, intelligent station, intelligent parking lot, and intelligent operation and maintenance based on the rail transit full-automatic unmanned driving, verify the technical feasibility of the cloud simulation platform, and also indicate a direction for a research path of a next-generation smart subway.

DESCRIPTION OF THE EMBODIMENTS

Clear and complete description will be made to the technical solutions in embodiments of the present invention in conjunction with drawings in the embodiments of the present invention hereafter. Obviously, the described embodiments are merely a part of embodiments of the present invention and not all the embodiments. Based on the embodiments of the present invention, all of other embodiments obtained by a person of ordinary skill in the art without any creative effort shall belong to the protection scope of the present invention.

Figure 1:
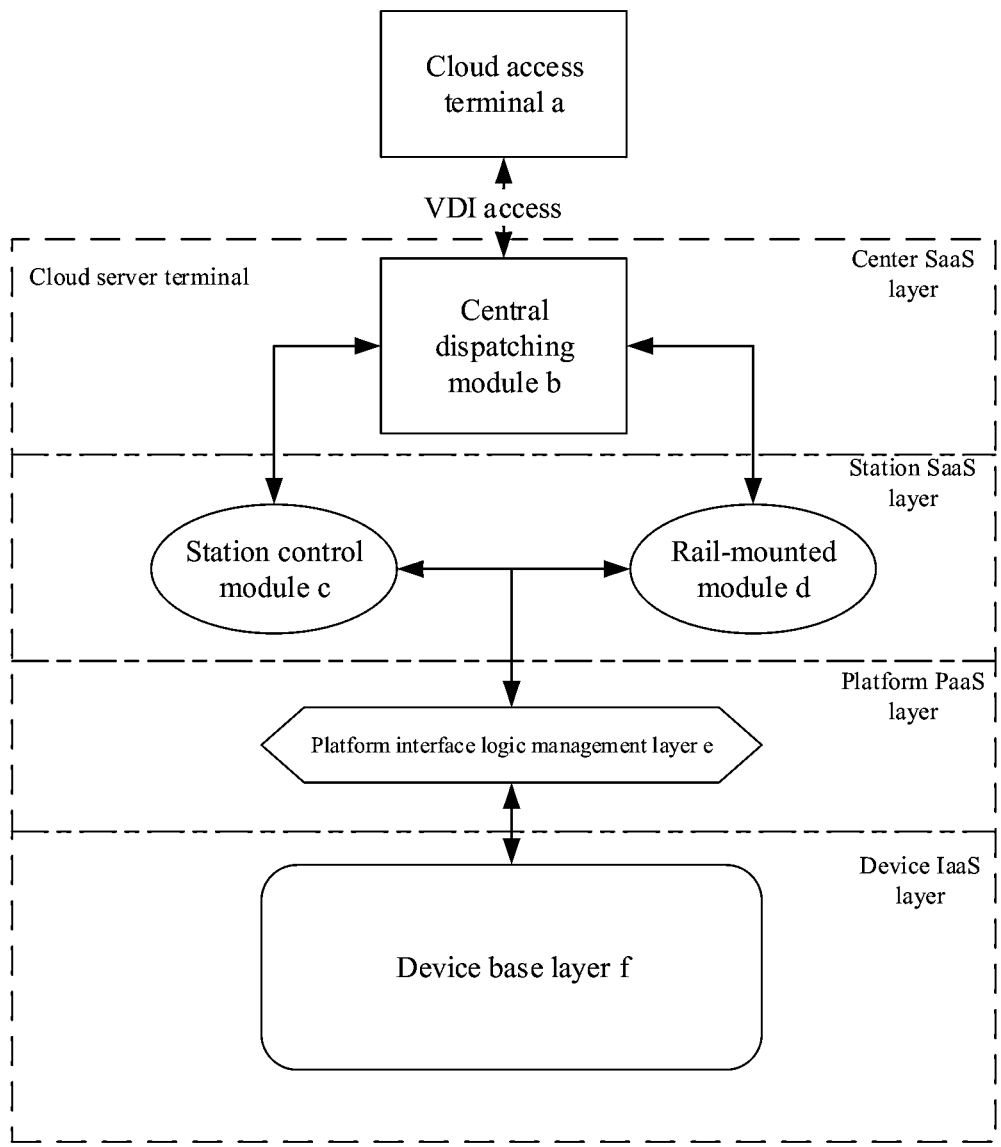
FIG. 1 is a schematic structural diagram of the present invention.

As show in FIG. 1, a cloud simulation apparatus for verifying a rail transit-oriented full-automatic unmanned driving scene includes a cloud access terminal a and a cloud server terminal, where the cloud server terminal includes a central dispatching module b, a station control module c, a rail-mounted module d, an interface logic management layer e, and a device base layer f, the cloud access terminal a is connected to the central dispatching module b, the central dispatching module b is connected to the station control module c and the rail-mounted module d respectively, every two of the station control module c, the rail-mounted module d, and the interface logic management layer e are connected, and the interface logic management layer e is connected to the device base layer f. The cloud is a core of a cloud computing simulation test, and all cloud test resources are controlled in a network and interface adaption manner. When a user has a test requirement, only a service request needs to be sent to a cloud test platform by using a network, and a cloud computing simulation test platform automatically calculates an optimal test resource configuration and automatically runs the optimal test resource configuration in a backend, and finally feeds a test result back to a local terminal.

The cloud access terminal a is connected to the central dispatching module b by a VDI communication protocol. The cloud access terminal (also referred to as a cloud terminal) is a terminal device of a cloud desktop technology, is connected to a system desktop of the cloud by the VDI communication protocol and displays the system desktop to a front end, and redirects output and input data of the cloud terminal to the cloud server terminal. The module includes a front end operation and a display program, and the backend is an extensible VDI to communicate with an external network. The cloud access terminal a can mainly implement controls and operations of a cloud access user, and feedback and display operation results.

Figure 2:
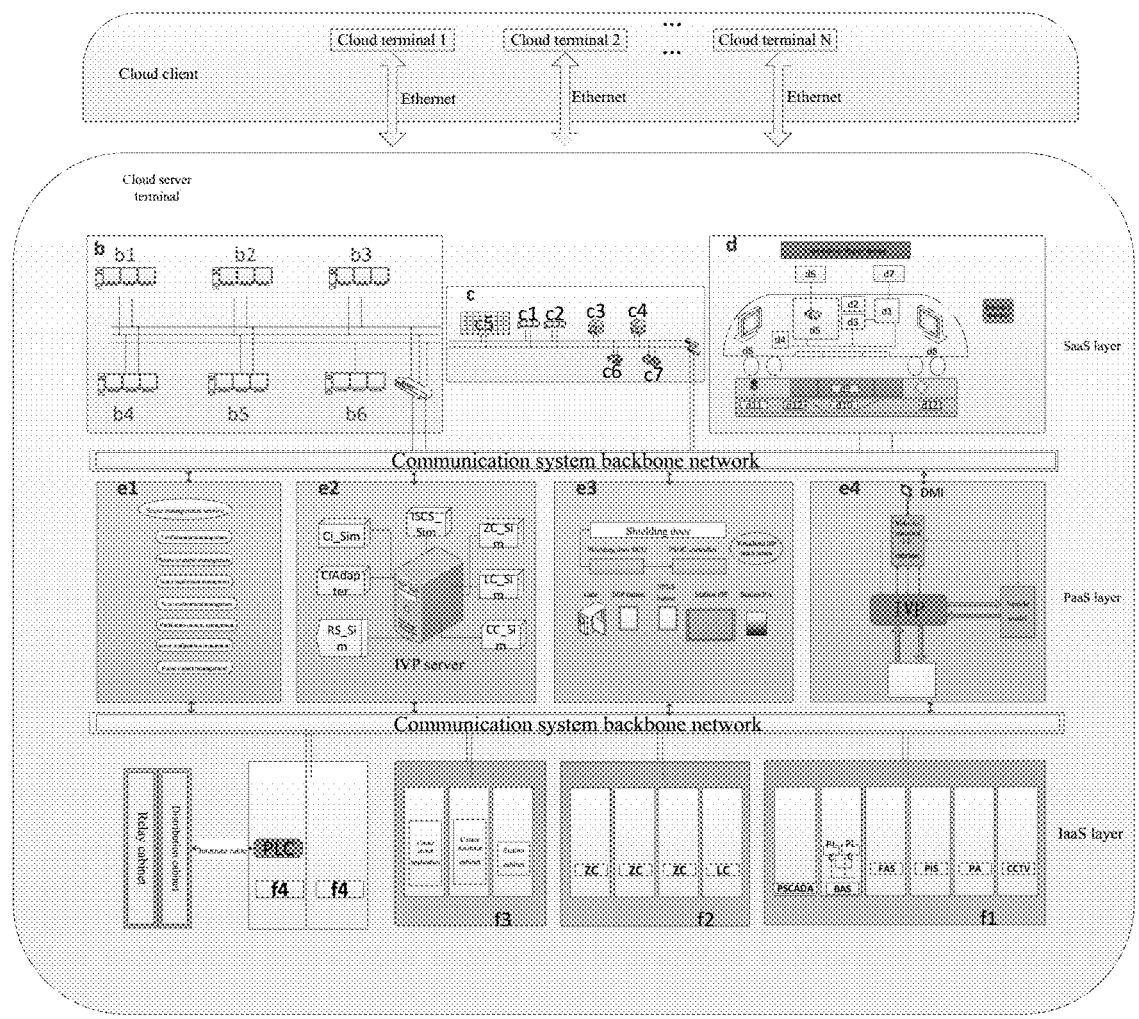
FIG. 2 is a specific schematic structural diagram of the present invention.

As shown in FIG. 2, the central dispatching module b includes a driving dispatching server b1, a vehicle dispatching server b2, a passenger dispatching server b3, a device dispatching server b4, a director dispatching server b5, and a maintenance dispatching server b6 that are connected to each other through a communication network, and the servers are implemented through software simulation.

The central dispatching module b is configured to: perceive and dynamically predict a passenger flow from multiple dimensions, implement accurate map paving, intelligent map adjustment and road-network collaboration, intelligently recognize a fault scene and an emergency scene and assist in decision-making, and perform multi-professional and multi-line fusion command based on a big data and intelligent calculation engine.

The station control module c includes an ATS workstation c1, an ISCS workstation c2, a station ATS server c3, a station ISCS server c4, an IBP disk c5, a LATS server c6, and a station FEP c7 that are connected to each other through a communication network, and the devices are implemented through software simulation.

The station control module c provides three functions of intelligent passenger transport management, equipment management, and passenger service around passenger service, including: (1) intelligent linkage of station systems and patterned control: efficient linkage between a normal mode and a fault mode; (2) intelligent collection and response of passenger flow information; (3) all-round passenger information prompt; (4) intelligent and energy-saving operation of the station systems; and (5) intelligent inspection. The rail-mounted module d includes a vehicle-mounted device and a railside device that are both implemented through software simulation, where the vehicle-mounted device includes a vehicle-mounted controller d1, a vehicle-mounted PIS d2, a vehicle-mounted TCMS d3, a MVB d4, a vehicle-mounted integrated supervision apparatus d5, a WIFI module d6, a vehicle-ground communication module d7, and a 3D driving simulation module d8, the MVB is connected to the vehicle-mounted integrated supervision apparatus, the vehicle-mounted TCMS, and the vehicle-mounted controller respectively, the vehicle-mounted controller is connected to the vehicle-mounted TCMS and the vehicle-ground communication module respectively, and the vehicle-mounted integrated supervision apparatus is connected to the vehicle-mount PIS, the vehicle-mounted TCMS, and the WIFI module respectively; and the railside device includes a shielding door d9, a turnout d10, a signal machine d11, and a beacon d12.

The rail-mounted module d is configured to implement automatic wake-up, vehicle track inspection, mainline operation, stopping and picking up, station departure, emergency intercom, passenger clearing by using a video, and docking and dormancy.

The interface logic management layer e includes a scene management platform layer e1, a logic simulation platform layer e2, a station interface simulation platform layer e3, and a vehicle interface simulation platform layer e4.

The interface logic management layer e includes interface adaption of devices, and simulation of a rail transit full-automatic logic and management of an unmanned driving scene, and is configured to receive upwardly an instruction delivered by a software service layer and transmit a message of the software service layer to the device base layer downwardly and provide service and management corresponding to the platform layers.

The logic simulation platform layer includes an IVP server, and the scene management platform layer includes verification plan management, scene example management, a scene requirement management, scene environment management, verification resource management, scene configuration management, and scene report management.

The device base layer f includes an ISCS system f1, an ATC system f2, an ATS system f3, and a CI system f4.

The device base layer f runs real rail transit full-automatic unmanned driving operation and control system software and data, and is configured to perform an interface test between systems, function and performance tests, an information security attack and defense drill test, and a fault injection test.

As shown in FIG. 1, in the present invention, according to a from-top-to-down structure of full-automatic unmanned driving, the entire rail transit full-automatic unmanned driving system is respectively divided into an SaaS layer, a PaaS layer, and an IaaS layer according to a cloud structure. Each layer is formed by a software and a hardware that correspond to the cloud server terminal, most layers adopt a software virtualization technology, and a small quantity of observable devices are formed by the hardwares. According to the cloud simulation apparatus and method for verifying a rail transit-oriented full-automatic unmanned driving scene oriented to a rail transit, the method includes the following steps.

Step 1. Start, by a cloud access terminal, a virtual device software in a center SaaS layer by using an Ethernet power supply management module, where the virtual device software includes a driving dispatching software, a vehicle dispatching software, an integrated dispatching software, a passenger dispatching software, and a maintenance dispatching software, covering signal dispatching, integrated supervision, and dispatching voice telephone systems. A centralized architecture is adopted as a whole, which can switch and log in to between dispatching professions, has an online linkage mode, and has a condition for linking to vehicle, platform door, and signal systems.

Step 2. Control, by the center SaaS layer, the virtual device software in a station SaaS layer remotely by using a remote intelligent startup instruction to implement intelligent remote startup. The station SaaS layer covers a signal ATS workstation software, an ISCS station workstation software, an IPB disk software, a station ATS server software, a station ISCS server software, an LATS software, and a station FEP software. The station SaaS layer has a condition for implementing communication and linkage with the center SaaS layer and a rail-mounted SaaS layer. A station operation scene and an emergency scene that are highly linked are verified by integrating functions of a plurality of subsystem involved in the station SaaS layer.

Step 3. Control a rail-mounted SaaS layer by both the center SaaS layer and the station SaaS layer and feed information back to the center and the station in real time. The rail-mounted SaaS layer includes a vehicle model software, a vehicle door and platform door model software, a rail signal machine and turnout model software, a departure indicator software, a platform PIS/PA software, an SPKS/ESP model software, and a crowdedness degree display software. The rail-mounted SaaS layer integrates professional station rail-mounted region passenger service functions and operation safety device models and performs comprehensive function verification on station operation and passenger service scenes.

Step 4. Send a result instruction calculated by using the SaaS layer to interface adapter resource pools included in a PaaS layer. The interface adapter resource pools, which are also referred to as verification interface basic resource pools, include a vehicle interface simulation platform resource pool and a station interface simulation platform resource pool, which are invoked by a logic simulation platform layer and a scene management platform layer in the PaaS layer for service.

Step 5. Mainly form the logic simulation platform layer in the PaaS layer by a set of virtual machine servers, where the logic simulation platform layer receives and sends data sent by the vehicle interface simulation platform resource pool and the station interface simulation platform resource pool on one hand, and processes instruction messages of the vehicle and the station at the same time, and are controlled by a scene management service platform layer in the PaaS layer.

Step 6. Form a scene management service in the PaaS layer by a series of cloud management basic services that are used for providing a platform-level scene management service and can be invoked by the SaaS layer. The scene management service in the PaaS layer includes a verification plan management service, a scene example management service, a scene requirement management service, a scene environment management service, a scene configuration management service, and a scene report management service.

Step 7. Form an IaaS layer by a series of semi-physical semi-simulation full automatic unmanned driving operation and control system facilities, where all the facilities are physical or virtualized. The facilities in the IaaS layer provide infrastructure facility services for the PaaS layer, are managed by the scene management service in the PaaS layer, and serve as a foundation of the entire cloud simulation system.

Step 8. Perform data exchange among the SaaS layer, the PaaS layer, and the IaaS layer, all operations being derived from a cloud terminal of the uppermost layer, and provide real-time state data feedback to the cloud terminal.

The present invention has been comprehensively applied to the verification of a rail transit full-automatic unmanned driving scene, which includes integrated test verification of a signal system and function verification of an unmanned driving system, supports comprehensive function verification, training, and demonstration of the unmanned driving system, and has a debugging, test and verification cloud simulation interface that is interconnection and intercommunication with a signal of an external manufacturer. In addition, scene deduction, design verification, interface test, system integration and another pre-operation service may be further provided for an unmanned driving project in real time, to comprehensively improve engineering design quality, shorten a construction period and reduce costs, and ensure that the project is put into use in one go at a highest operation automation level. By using the cloud computation simulation method and apparatus, a function model is established for another facility in the rail transit full-automatic operation scene, a high-performance simulation engine is loaded, and test and scene verification of an unmanned driving function are performed in a combination of virtual and reality and integrated linkage manner, to achieve the same effect as actual operation on site.

The above descriptions are only specific implementations of the present invention. However, the protection scope of the present invention is not limited thereto, any person skilled in the art can easily think of various equivalent modifications or substitutions within the technical scope disclosed by the present invention, and all of these modifications or substitutions shall fall within the protection scope of the present invention. Therefore, the protection scope of the present invention should be determined with reference to the appended claims.

What is claimed is:

1. A cloud simulation apparatus for verifying a full-automatic unmanned driving scene oriented to a rail transit, the cloud simulation apparatus comprising a cloud access terminal and a cloud server terminal, wherein the cloud server terminal comprises a central dispatching module, a station control module, a rail-mounted module, an interface logic management layer, and a device base layer, the cloud access terminal is connected to the central dispatching module, the central dispatching module is connected to the station control module and the rail-mounted module respectively, every two of the station control module, the rail-mounted module, and the interface logic management layer are connected, and the interface logic management layer is connected to the device base layer, wherein the central dispatching module comprises a driving dispatching server, a vehicle dispatching server, a passenger dispatching server, a device dispatching server, a director dispatching server, and a maintenance dispatching server that are connected to each other through a communication network, and the servers are implemented through software simulation; and the central dispatching module is configured to: perceive and dynamically predict a passenger flow from multiple dimensions, implement accurate map paving, intelligent map adjustment and road-network collaboration, intelligently recognize a fault scene and an emergency scene and assist in decision-making, and perform multi-professional and multi-line fusion command based on a big data and intelligent calculation engine.

2. The cloud simulation apparatus for verifying a rail transit-oriented full-automatic unmanned driving scene according to claim 1, wherein the cloud access terminal is connected to the central dispatching module by a virtual desktop infrastructure (VDI) communication protocol; and the cloud access terminal is configured to implement controls and operations of a cloud access user, and to feedback and display operation results.

3. A cloud simulation method for verifying a rail transit-oriented full-automatic unmanned driving scene, comprising the following steps:

step 1: starting, by a cloud access terminal, a virtual device software in a center software-as-a-service (SaaS) layer by using an Ethernet power supply management module, wherein the virtual device software comprises a driving dispatching software, a vehicle dispatching software, an integrated dispatching software, a passenger dispatching software, and a maintenance dispatching software, covering signal dispatching, integrated supervision, and dispatching voice telephone systems;

step 2: controlling, by the center SaaS layer, the virtual device software in a station SaaS layer remotely by using a remote intelligent startup instruction to implement intelligent remote startup, where the station SaaS layer covers a signal ATS workstation software, an ISCS station workstation software, an IPB disk software, a station ATS server software, a station ISCS server software, an LATS software, and a station FEP software;

step 3: controlling a rail-mounted SaaS layer by both the center SaaS layer and the station SaaS layer and feeding information back to the center and the station, where the rail-mounted SaaS layer includes a vehicle model software, a vehicle door and platform door model software, a rail signal machine and turnout model software, a departure indicator software, a platform PIS/passenger address (PA) software, an SPKS/ESP model software, and a crowdedness degree display software, and integrates professional station rail-mounted region passenger service functions and operation safety device model and performs comprehensive function verification on station operation and passenger service scenes;

step 4: sending a result instruction calculated by using the SaaS layer to interface adapter resource pools included in a platform-as-a-service (PaaS) layer, where the interface adapter resource pools include a vehicle interface simulation platform resource pool and a station interface simulation platform resource pool, which are invoked by a logic simulation platform layer and a scene management platform layer in the PaaS layer for service;

step 5: the logic simulation platform layer in the PaaS layer including a set of virtual machine servers, configured to receive and send data sent by the vehicle interface simulation platform resource pool and the station interface simulation platform resource pool, and process instruction messages of the vehicle and the station, and controlled by a scene management service platform layer in the PaaS layer;

step 6: a scene management service in the PaaS layer including a series of cloud management basic services that are used for providing a platform-level scene management service and can be invoked by the SaaS layer, where the scene management service in the PaaS layer includes a verification plan management service, a scene example management service, a scene requirement management service, a scene environment management service, a scene configuration management service, and a scene report management service;

step 7: an infrastructure-as-a-service (IaaS) layer including a series of semi-physical semi-simulation full automatic unmanned driving operation and control system facilities, where all the facilities are physical or virtualized, and the facilities in the IaaS layer provide infrastructure facility services to the PaaS layer and are managed by the scene management service in the PaaS layer; and step 8: performing data exchange among the SaaS layer, the PaaS layer, and the IaaS layer, all operations being derived from a cloud terminal of the uppermost layer, and providing real-time state data feedback to the cloud terminal.

4. A cloud simulation apparatus for verifying a full-automatic unmanned driving scene oriented to a rail transit, the cloud simulation apparatus comprising a cloud access terminal and a cloud server terminal, wherein the cloud server terminal comprises a central dispatching module, a station control module, a rail-mounted module, an interface logic management layer, and a device base layer, the cloud access terminal is connected to the central dispatching module, the central dispatching module is connected to the station control module and the rail-mounted module respectively, every two of the station control module, the rail-mounted module, and the interface logic management layer are connected, and the interface logic management layer is connected to the device base layer, wherein the station control module comprises an automatic train supervision (ATS) workstation, an integrated supervisory control system (ISCS) workstation, a station ATS server, a station ISCS server, an integrated backup panel (IBP) disk, a local ATS (LATS) server, and a station front end processor (FEP) that are connected to each other through a communication network, and the devices are implemented through software simulation; and the station control module provides three functions of intelligent passenger transport management, equipment management, and passenger service around passenger service, comprising: intelligent linkage of station systems and patterned control: efficient linkage between a normal mode and a fault mode; intelligent collection and response of passenger flow information; all-round passenger information prompt; intelligent and energy-saving operation of the station systems; and intelligent inspection.

5. The cloud simulation apparatus for verifying a rail transit-oriented full-automatic unmanned driving scene according to claim 1, wherein the rail-mounted module comprises a vehicle-mounted device and a railside device that are both implemented through software simulation;

the vehicle-mounted device comprises a vehicle-mounted controller, a vehicle-mounted passenger information system (PIS), a vehicle-mounted train control and management system (TCMS), a multifunction vehicle bus (MVB), a vehicle-mounted integrated supervision apparatus, a WIFI module, a vehicle-ground communication module, and a 3D driving simulation module, the MVB is connected to the vehicle-mounted integrated supervision apparatus, the vehicle-mounted TCMS, and the vehicle-mounted controller respectively, the vehicle-mounted controller is connected to the vehicle-mounted TCMS and the vehicle-ground communication module respectively, and the vehicle-mounted integrated supervision apparatus is connected to the vehicle-mount PIS, the vehicle-mounted TCMS, and the WIFI module respectively;

the railside device includes a shielding door, a turnout, a signal machine, and a beacon, the rail-mounted module is configured to implement automatic wake-up, vehicle track inspection, mainline operation, stopping and picking up, station departure, emergency intercom, passenger clearing by using a video, and docking and dormancy.

6. The cloud simulation apparatus for verifying a rail transit-oriented full-automatic unmanned driving scene according to claim 1, wherein the interface logic management layer comprises a scene management platform layer, a logic simulation platform layer, a station interface simulation platform layer, and a vehicle interface simulation platform layer; and the interface logic management layer comprises interface adaption of devices, and simulation of a rail transit full-automatic logic and management of an unmanned driving scene, and is configured to receive upwardly an instruction delivered by a software service layer and transmit a message of the software service layer to the device base layer downwardly and provide service and management corresponding to the platform layers.

7. The cloud simulation apparatus for verifying a rail transit-oriented full-automatic unmanned driving scene according to claim 6, wherein the logic simulation platform layer comprises an intelligent verification platform (IVP) server, and the scene management platform layer comprises verification plan management, scene example management, scene requirement management, scene environment management, verification resource management, scene configuration management, and scene report management.

8. The cloud simulation apparatus for verifying a rail transit-oriented full-automatic unmanned driving scene according to claim 1, wherein the device base layer comprises an ISCS system, an automatic train control (ATC) system, an ATS system, and a continuous integration (CI) system; and the device base layer runs real rail transit full-automatic unmanned driving operation and control system software and data, and is configured to perform an interface test between systems, function and performance tests, an information security attack and defense drill test, and a fault injection test.

9. The method according to claim 3, wherein the station SaaS layer has a condition for implementing communication and linkage with the center SaaS layer and the rail-mounted SaaS layer, and a station operation scene and an emergency scene that are highly linked are verified by integrating functions of a plurality of subsystem involved in the station SaaS layer.

* * * * *